(12) United States Patent
Wendelspiess

(10) Patent No.: US 11,644,253 B2
(45) Date of Patent: May 9, 2023

(54) COOLER AND COOLER BODY

(71) Applicant: BRUSA Electronik AG, Sennwald (CH)

(72) Inventor: Ueli Wendelspiess, Sennwald (CH)

(73) Assignee: BRUSA Elektronik AG, Sennwald (CH)

( * ) Notice: Subject to any disclaimer, the term of this patent is extended or adjusted under 35 U.S.C. 154(b) by 390 days.

(21) Appl. No.: 16/937,387

(22) Filed: Jul. 23, 2020

(65) Prior Publication Data

US 2021/0037678 A1    Feb. 4, 2021

(30) Foreign Application Priority Data

Jul. 30, 2019   (EP) .................................. 19189127
Jul. 30, 2019   (EP) .................................. 19189229

(51) Int. Cl.
| | | |
|---|---|---|
| *F28F 3/04* | (2006.01) | |
| *H05K 7/20* | (2006.01) | |
| *F28F 3/12* | (2006.01) | |
| *F28F 13/12* | (2006.01) | |

(52) U.S. Cl.
CPC ............... *F28F 3/048* (2013.01); *F28F 3/12* (2013.01); *F28F 13/12* (2013.01); *H05K 7/20409* (2013.01); *H05K 7/20481* (2013.01)

(58) Field of Classification Search
CPC .............. F28F 3/048; F28F 3/12; F28F 13/12; H05K 7/20409; H05K 7/20481
See application file for complete search history.

(56) References Cited

U.S. PATENT DOCUMENTS

| | | | | |
|---|---|---|---|---|
| 3,524,497 A | * | 8/1970 | Chu ...................... | H01L 23/473 174/15.1 |
| 5,774,334 A | * | 6/1998 | Kawamura ......... | H01L 23/4338 165/80.4 |
| 5,988,266 A | * | 11/1999 | Smith ................. | H01L 21/4882 174/16.3 |
| 6,050,332 A | * | 4/2000 | Smith ................. | H01L 23/3672 174/16.3 |
| 6,650,538 B1 | * | 11/2003 | Chu ...................... | H01L 23/467 257/722 |
| 7,509,995 B2 | * | 3/2009 | Bhatti ................. | F28D 15/0233 165/80.4 |
| 7,588,074 B1 | * | 9/2009 | White ................... | F28F 3/083 257/722 |
| 2012/0012295 A1 | * | 1/2012 | Kakiuchi ............... | F28F 13/06 165/185 |
| 2017/0092565 A1 | | 3/2017 | Chen et al. | |

FOREIGN PATENT DOCUMENTS

| | | |
|---|---|---|
| CN | 105514064 A | 4/2016 |
| EP | 2291859 A1 | 3/2011 |

OTHER PUBLICATIONS

Extended European Search Report dated Jan. 24, 2020 in European Patent Application No. 19189229.8, 5 pages.
Extended European Search Report dated Jan. 24, 2020 in European Patent Application No. 19189127.4, 5 pages.

* cited by examiner

*Primary Examiner* — Tho V Duong
(74) *Attorney, Agent, or Firm* — Hoffmann & Baron, LLP

(57) ABSTRACT

The invention relates to a cooler or cooler body which in particular is adapted for cooling electronic structural units or assemblies.

10 Claims, 8 Drawing Sheets

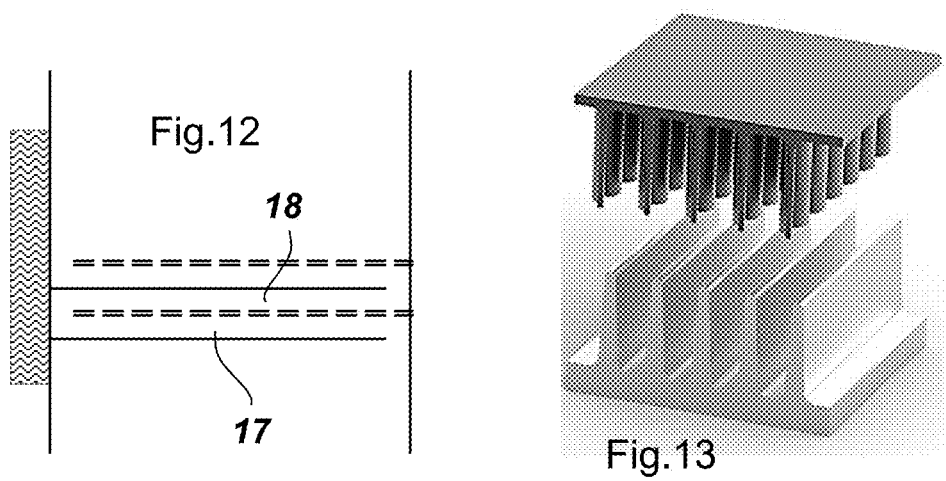
Fig.12
Fig.13
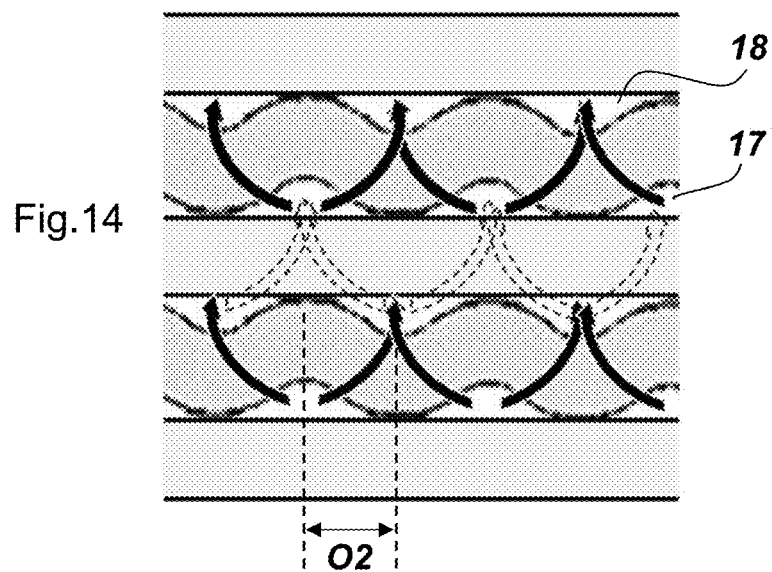
Fig.14
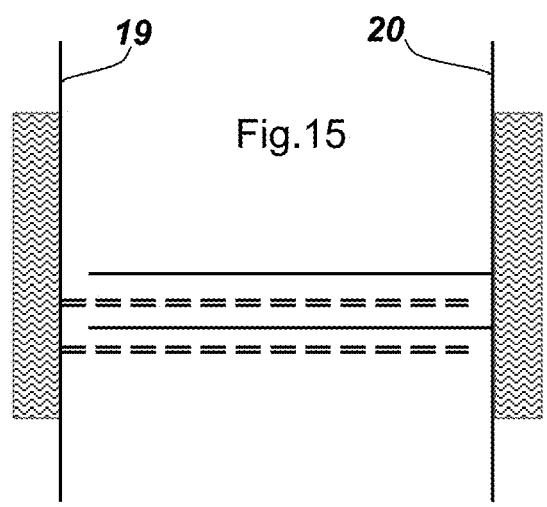
Fig.15

COOLER AND COOLER BODY

CROSS-REFERENCE TO RELATED APPLICATIONS

This patent application claims priority to European Patent Application 19189127.4 filed Jul. 30, 2019 and European Patent Application 19189229.8 filed Jul. 30, 2019, the contents of both European patent applications are hereby incorporated herein by reference for all purposes.

FIELD OF THE INVENTION

The present invention relates to a cooler and cooler body which in particular are adapted for cooling electronic structural units or assemblies.

BACKGROUND OF THE INVENTION

As is known, the power dissipation and hence the heat evolution of electronic assemblies are increasing with the power-related further development of the electronic structural elements. It is true that these components are becoming smaller but their efficiency and hence the heat to be removed are increasing. Furthermore, due to their compactness, these electronic elements are positioned in a smaller space so that once again a higher local heat development results. The power dissipations achieved would be possible only with complicated and bulky cooling bodies when employing fan cooling and are therefore unacceptable. In case of large losses, air cooling therefore clearly reaches its limits.

The new high-performance processors deliver about 70 to 100 W over an area of about 10 $cm^2$ and thus achieve a far higher heat flux density. The processor manufacturers predict that a further increase in the waste heat is to be expected in the years ahead. In view of this development, those skilled in the art are considering liquid cooling for such applications. Liquid cooling more effectively dissipates the heat from the electronic assemblies, with the result that a higher power density is possible. Liquid coolers also allow more compact switch cabinets with numerous electronic components and operate very quietly.

An exemplary generic cooling apparatus is disclosed in EP 2 291 859 A1, in which an insert is provided inside a cooling channel, the insert having a plurality of pins forming channels towards a cooler wall and being supplied with coolant via openings in an inclined surface of the inlet which is hit by a coolant flow from the coolant channel.

Specifically in the field of power electronics in automotive applications, more specific for inverter, converter and charger devices for electric vehicles, there is a need for an intense cooling of the electronic components, especially of the switching components like IGBT's or MOSFET's (since these are the components with the highest amount of power loss in such devices and therefore are the main heat sources within these).

To realize an effective cooling at an affordable price is difficult because due to physical restrictions liquids like water have to be used as a heat sink in combination with flow channels which provide large exchanging surfaces and produce high heat transfer coefficients. Further construction materials have to be used which provide a high thermal conductivity.

A further demanding requirement is that there has to be direct contact between the electronic component and the cooling system (under avoidance of any air gaps to ensure sufficient heat conductivity) while simultaneously ensuring sufficient electrical insulation and avoiding mechanical stresses acting on the electronic component (e.g. due to vibration or thermal expansion).

Further requirements especially for automotive solutions are that the cooling liquid has to transfer the received heat to the ambient air (via the vehicles radiator) which (in the worst case scenario for which the system has to be designed) can reach high temperatures (e.g. Dubai summer conditions). This leads to higher temperature levels of the cooling liquid compared to non-automotive applications and therefore to higher needed liquid flow rates. Therefore, such cooling systems have an increased need for a low pressure drop design to avoid to high pressure drops due to higher flow velocities.

Due to increased security and maintenance demands (compared to stationary installations) an automotive cooling solution has an increased need for debris insensitivity. In addition, an automotive cooling system solution has to be designed appropriate to series production.

OBJECT OF THE INVENTION

The invention provides an improved cooler or cooler body, which, while being as compact as possible, permits a more effective cooling structure and a simpler design.

A further object of the invention is to provide a cooler or cooler body, meeting the demands of cooling of electronic components in the automotive sector as described above.

SUMMARY OF THE INVENTION

First Aspects of the Invention

First aspects of the invention relate to a cooler comprising an inlet, an outlet, a first unit, and a second unit, the inlet configured for feeding the cooler with coolant, the outlet configured for discharging said coolant, the first unit comprising a first plane for receiving a first part to be cooled, a first unit first fin, and a first unit second fin, the first unit first fin extending from a first unit first root to a first unit first fin front, the first unit second fin extending from the first unit first root to a first unit second fin front, the first plane being in uninterrupted thermal contact with the first unit first root, the first unit first fin having a first unit first fin first surface, the first unit second fin having a first unit second fin first surface, the second unit comprising a second unit first fin, the second unit first fin having a second unit first fin first front, a second unit first fin first surface, and a second unit first fin second surface, the second unit first fin located at least in part between the first unit first fin and the first unit second fin such that the first unit first root is adjacent to the second unit first fin first front leaving a first gap, the first unit first fin first surface is abutting the second unit first fin first surface, and the first unit second fin first surface is abutting the second unit first fin second surface, at least one of the first unit first fin first surface and the second unit first fin first surface having a first corrugated structure, the first corrugated structure forming first inbound channels between the first unit first fin first surface and the second unit first fin first surface, at least one first inbound channel being configured for forming a first coolant inbound flow from the first unit first fin first front towards the first unit first root and causing the first coolant inbound flow to impinge and laterally widen on the first unit first root.

At least one of the first unit second fin first surface and the second unit first fin second surface may have a second corrugated structure, the second corrugated structure forming first reverse channels between the first unit second fin first surface and the second unit first fin second surface, the first reverse channels being offset relative to the first inbound channels, each of two neighbouring first reverse channels, which are closest to the first inbound channel, being configured for receiving a part of the impinged and widened first coolant inbound flow and forming a first coolant reverse flow from the first unit first root towards the first unit second fin front.

In another embedment, the second unit first fin first front may be a second unit first fin front, the first unit second fin having a first unit second fin second surface, the second unit comprising a second unit second fin, the second unit second fin having a second unit second fin front and a second unit second fin first surface, the second unit first fin extending from a second unit first root to the second unit first fin front, the second unit second fin extending from the second unit first root to the second unit second fin front, the first unit second fin located between the second unit first fin and the second unit second fin such that the second unit first root is adjacent to the first unit second fin front leaving a second gap, the first unit second fin second surface is abutting the second unit second fin first surface, the first reverse channels being second inbound channels, the first coolant reverse flow being a second coolant inbound flow, at least one second inbound channel being configured for forming the second coolant inbound flow from the second unit first fin front towards the second unit first root, causing the second coolant inbound flow to impinge and laterally widen on the second unit first root, at least one of the second unit second fin first surface and the first unit second fin second surface having a third corrugated structure, the third corrugated structure forming second reverse channels between the second unit second fin first surface and the first unit second fin second surface, the second reverse channels being offset relative to the second inbound channels, each of two neighbouring second reverse channels, which are closest to said second inbound channel, being configured for receiving a part of the impinged and widened second coolant inbound flow and forming a second coolant reverse flow from the second unit first root towards the second unit second fin front.

The second unit first fin may have a second unit first fin second front opposing the second unit first fin first front, wherein the cooler comprises a third unit, the third unit comprises a third unit first fin, and a third unit second fin, the third unit first fin extending from a third unit first root to a third unit first fin front, the third unit second fin extending from the third unit first root to a third unit second fin front, the third unit first fin having a third unit first fin first surface, the third unit second fin having a third unit second fin first surface.

In a further embodiment, the second unit first fin is further located at least in part between the third unit first fin and the third unit second fin such that the third unit first root is adjacent to the second unit first fin second front leaving a third gap, the third unit first fin first surface is abutting the second unit first fin first surface, and the third unit second fin first surface is abutting the second unit first fin second surface.

The second unit first fin may further be located at least in part neighbouring the third unit first fin such that the third unit first root is adjacent to the second unit first fin second front leaving a fourth gap, the third unit first fin first surface is abutting the second unit first fin second surface the third unit first root being arranged for receiving coolant from the inlet.

The third unit may comprise a plane for receiving a second part to be cooled and the third plane being in uninterrupted thermal contact with the third unit first root.

The cooler may be an electronic element cooler and the first part to be cooled being an electronic element.

In another embedment, the second unit may be of a plastic material.

The inlet may be arranged and configured to be upstream to the first gap, and the outlet being arranged and configured to be downstream to the first reverse channels.

In another embedment, the first unit or the second unit is a finned component of a material containing aluminium.

The first unit first root may be configured for causing a split-up of the first coolant inbound flow into two part-flows, the two part-flows entering said two neighbouring first reverse channels.

In another embedment, the first unit first root is one side of a heat-conducting cooler wall, the first plane being an opposite side of the heat-conducting cooler wall.

The first unit and the second unit may be configured for forming a housing.

In another embedment, the first unit and the third unit are configured for forming a housing, in particular and the second unit is configured for forming the housing in combination with the first and third unit.

Second Aspects of the Invention

Second aspects of invention relate to a cooler body, preferably designed for cooling of an electronic element, comprising a contact piece which comprises a contact surface for (thermal) contact to the part to be cooled and a base piece spaced apart from the contact piece by a middle piece in between the contact piece and the base piece. The middle piece comprises separate or individual holes forming multiple rows of parallelly arranged coolant pipes, whereby each pipe extends substantially from the contact piece to the base piece. At least two coolant channels—the channels enabling a flow of coolant (preferably water is to be used as heat sink) from a coolant inlet to a coolant outlet—are formed by a sequence of parallel pipes connected by an enclosing surface of the contact piece and an enclosing surface of the base piece in such a way that each of the coolant channels run multiple times from the contact piece to the base piece and vice versa.

Preferably, the cooler body comprises five or more of such coolant channels, for example a number of five to ten coolant channels. As another preferred option, the enclosing surface of the contact piece and the base piece each comprise multiple protrusions arranged successively and spaced apart from another on each enclosing surface, two successive protrusions together with part of the respective enclosing surface (and an end face of the middle piece) forming a cavity or chamber, the cavity connecting a pipe with the subsequent pipe. For example, essentially an enveloping piece (base piece or contact piece) provides chambers between itself and the middle piece by limiting protrusions whereby two neighbors of the parallel pipes lead into each chamber, thus enabling an inflow and a reverse outflow. Preferably, the protrusions are embodied as fin-like structures. Such fin-like structures can be have a straight form, or a waved form or a zig-zag-form and are preferably arranged transverse to an extension direction of the base/contact piece.

Preferably, subsequent pipe rows are offset to each other (with respect to a general or overall flow direction of each channel).

In embodiments with cavities as described above, optionally each cavity connects the exits of all pipes of a row with all entries of the pipes of the subsequent row.

Preferably, the body is made from ceramic, preferably electrically insulating and thermally well conductive ceramic such as aluminium oxide or aluminium nitride. Alternatively, the body is made from metal such as aluminium or copper.

In case of a ceramic body, the body optionally is a monolithic one, preferably manufactured by sintering green ceramic parts (raw material) of the base, middle and contact piece together in one step. Thus, additional assembly steps and thermal interfaces can be avoided.

As an option, the base piece and the contact piece are embodied as parallel plates, whereby preferably an extension direction of the plates defines a general or overall direction of the channels. As another option, the base piece also serves as a contact piece for contacting the part to be cooled.

As another option, the enclosing surface of the contact piece and the enclosing surface of the base piece are facing each other and/or the pipes are arranged at least roughly perpendicular to the enclosing surfaces.

In some embodiments, the base piece and the contact piece comprise stabilizing ribs and/or the contact surface is designed for direct attachment to the part to be cooled.

The invention also relates to a cooler, in particular electronic element cooler, specifically automotive power electronic cooler, comprising a cooler body according to the invention.

The invention also relates to use of a cooler body according to the invention in a power electronics system, in particular in an automotive power electronics system.

BRIEF DESCRIPTION OF THE DRAWINGS

By way of example only, preferred embodiments of the invention will be described more fully hereinafter with reference to the accompanying figures, wherein:

FIGS. 1 to 23 are relating to the first aspects of the invention, as follows:

FIGS. 1 to 5 show different view of a first embodiment of a cooler according to the first aspects of the invention;

FIG. 6 shows an abstracted view of a coolant flow through a cooler according to one embodiment of the first aspects of the invention;

FIGS. 7 to 11 show different possible aspects of embodiments of a cooler according to the first aspects of the invention;

FIGS. 12 to 14 show different views of a further embodiment of a cooler according to the first aspects of the invention;

FIG. 15 shows a further modification of an embodiment of a cooler according to the first aspects of the invention;

FIGS. 16, 17 and 18 show a further varied aspect of an embodiment of a cooler according to the first aspects of the invention;

FIGS. 19 and 20 show different views of yet a further embodiment of a cooler according to the first aspects of the invention;

FIGS. 21 and 22 shows different views of yet another embodiment of a cooler according to the first aspects of the invention;

FIG. 23 shows an exemplary configuration of how a part to be cooled is applied on the first plane;

FIGS. 24 to 25 are relating to the second aspects of the invention, as follows:

FIG. 25 shows a further embodiment of parts of a cooler body.

The Figures related to the first aspects of the invention, i.e. FIGS. 1 to 23, and the second aspects of the invention, i.e. FIGS. 24a-c to 25, do not use the same numerals to indicate the same features.

DETAILED DESCRIPTION OF THE DRAWINGS

Figure 1:
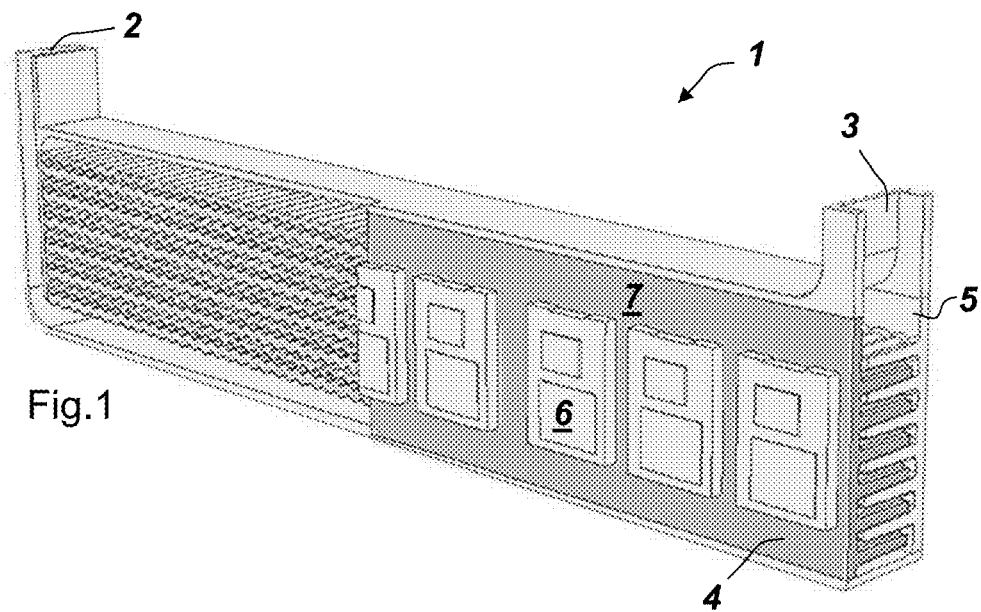

First Aspects of the Invention:

FIG. 1 shows a first embodiment of a cooler 1 according to the first aspects of the invention. The cooler 1 has an inlet 2 and an outlet 3, a first unit 4 and a second unit 5. A first part to be cooled 6, in particular an electronic element, is applied on a first surface 7 of the first unit 4. The cooler is fed by the inlet 2 with coolant, which distributes in a lower part of the cooler, more or less evenly along a long side of the cooler, and is then guided forth and back through a plurality of channels formed by fins of the first and second unit until it arrives in an upper part of the cooler which accesses the outlet 3 where the coolant is discharged. The formations of the inlet 2 and/or outlet 3 can be part of the first and/or second unit or can be separate elements connectable with the first and second unit. The first and second unit can together form a housing. In a particular embodiment, the first and second unit form a housing together with at least one of a separate inlet, a separate outlet, and a separate wall element.

In the example shown in FIG. 1, the fed coolant first comes into contact with a fin of the first unit. However, as well, the first fin to come into contact with the coolant can also be from the second unit. The fins of the first and second unit intertwine, i.e. they are put together such that the fins of the first unit and the second unit alternate. In this way, the coolant is sent forth and back, at every turn impinging on the backside of the plate having the first surface 7. The area of impinging is named "root" in the following. The term "intertwine" is to be interpreted as implying the involved units both (a) having at least in some parts contact and (b) having at least in some parts no contact at all.

Figure 2:
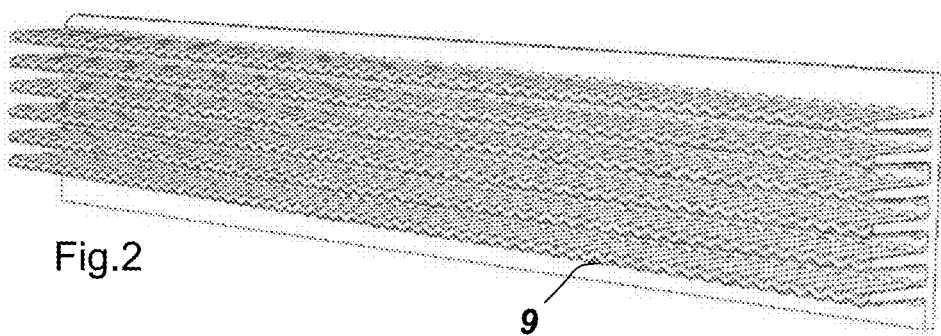

To more easily understand the structure, FIG. 2 shows a section of the second unit of FIG. 1. It is noted that such structure is by way of example only. The inventive principle can also be achieved with various other structures, as will be shown below. The fins 9 in FIG. 2 ("second unit fins") have a waved profile. They extend from a root section ("second unit roots") to a front section ("second unit fronts").

Figure 3:
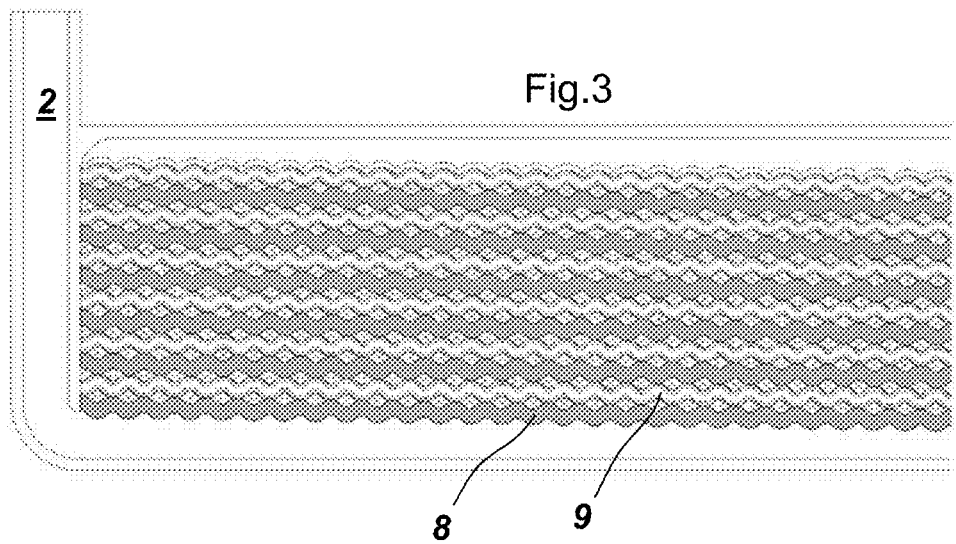
Figure 4:
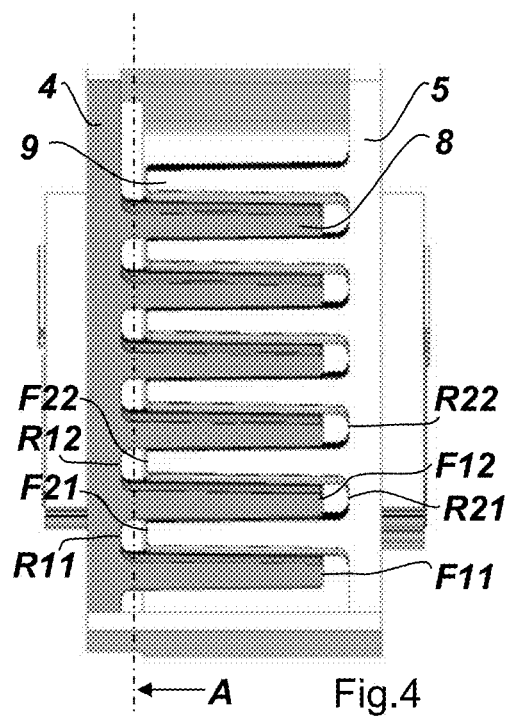

FIG. 3 shows a cross-sectional view along the long side and perpendicular to an alignment of the corrugated structure of the fins. In this situation, the first and second unit are stuck together, which is why the second unit fins 9 are visible here as well as first unit fins 8. A particular feature of the embodiment of FIG. 3 is that a longitudinal orientation of the fins a slight inclination in order to further improve an even longitudinal distribution of the coolant to achieve a uniform pressure drop. However, this inclination is optional and not necessary in all embodiments of the first aspects of the invention. Each of the corrugated structures has for example a waved pattern, a zigzag pattern, a meander pattern, or a trapezoidal pattern FIG. 4 shows a side view such that the long side is essentially perpendicular to the paper level and one can see the single fins 8 of the first unit and the single fins 9 of the second unit being intertwined. The coolant by which the cooler is fed, arrives below the first fin of the first unit 8 on the bottom where it distributes along the long side. The coolant then finds its way around the front section F11 of said first fin to travel between said first fin of the first unit and the first fin of the second unit. This mechanism will be explained more generally for FIG. 6 below. Said travel between two fins takes place in channels which are formed with a corrugated structure on at least one of the participating fins.

Figure 5:
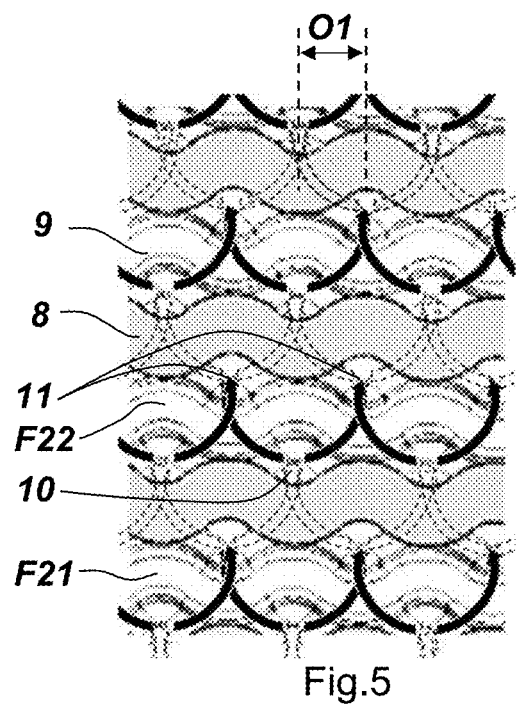

FIG. 5 shows an example for this formation of channels, which is in accordance with the structure of the fins in FIGS. 1 to 4 where the fins of both of the first and second unit have a waved form. FIG. 5 shows the cross-section view of FIG. 3 in greater detail from the first unit 4 towards the second unit 5. This cross-section view corresponds to the cut plane A indicated in FIG. 4. As can be seen in FIG. 5, the fins are arranged and abutting one another in such a way that said waves are offset relative to each other to form the channels. That is to say, the reverse channels are shifted by the offset O1 relative to the inbound channels.

A coolant flow is indicated by the full arrows and the dashed arrows. The full arrow flow could be seen from the perspective of the cutting plane A, the dashed arrow flow is a reverse flow actually covered by the fins from this perspective. So, the fins 8 are actually cut in this view, and from the fins 9 we can see the front section uncut. The area of full arrows is a root (section) of the first unit where a cooling impingement takes place. After the coolant coming from an inbound flow 10 frontally impinged on the root, it is split up into two flow parts laterally diverging into reverse channels 11 to the next "floor" or "level". This split-up of the single channel flows allows an extra cooling effect which increases the overall efficiency. Apart from the ever first inbound flow in the system, all other inbound flows are reverse flows from a respective preceding inbound flow.

Figure 6:
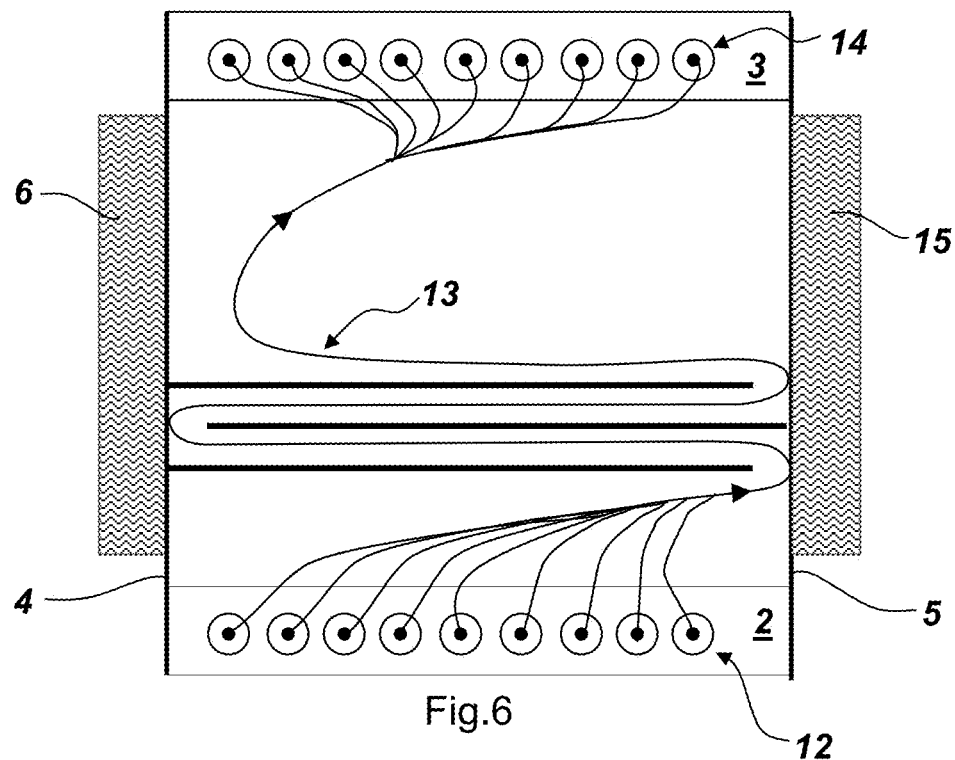

An abstracted cross-sectional side view of the first embodiment is shown in FIG. 6. The arrow heads 12 indicate a direction from the paper level out of the plane and show an exemplary flow of coolant from the inlet feeding the cooler. The lines 13 indicate the flow progress of the coolant through the cooler, i.e. from the inlet 2 towards an outlet 3, wherein the arrow heads 14 again are directed out of the plane, i.e. perpendicular to the paper level, and indicate how the used coolant is discharged. Of course, the flowing direction of the coolant in the inlet relative to the outlet can also be opposed (from the top to the bottom). In particular, the flow direction in the inlet and/or the outlet is not necessarily perpendicular to the paper level in the view of FIG. 1. In this first embodiment, the cooler can cool two parts 6 and 15 which are arranged on planes of the units 4 and respectively 5. These part carrying planes are the opposite sides of the respective roots of the units (see R11, R12 and R21, R22 in FIG. 4). FIG. 6 shows only two fins of the first unit 4 and second unit 5, however this only serves the illustration of the coolant flowing principle and of course the respective assemblies can comprise many more fins.

While FIG. 6 is undescriptive about which fins and/or which side of the fins has a corrugated structure, FIGS. 7, 9, 11, 12, 14, and 15 show some of the various possibilities.

Figure 7:
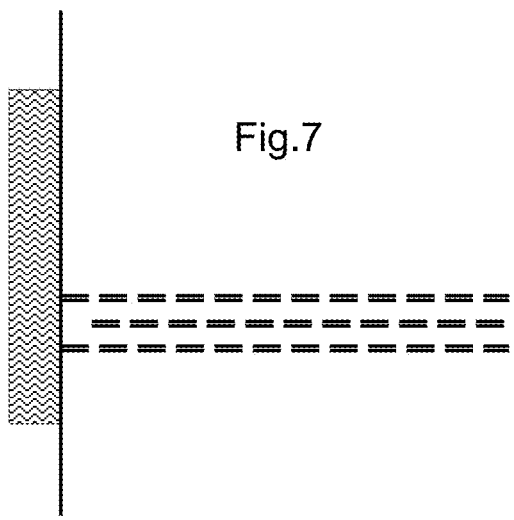
Figure 8:
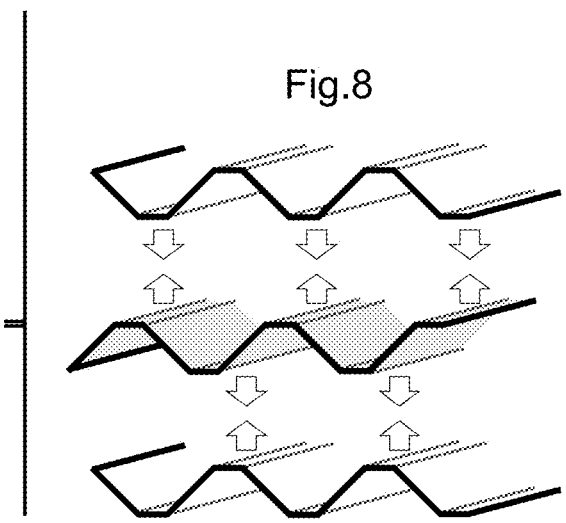

The corrugations of the embodiment according to FIGS. 1 to 5 are represented by the layout of FIG. 7. The double dashed line means both sides of the fins have a corrugated structure, in this case a wave structure. A further possibility of a double-sided structure of fins in shown in FIG. 8, wherein the indentations are abutting in an assembled situation (indicated by the arrows). In other words, the structure is not necessarily rounded, it can also have an edged meander-type of shape. The sketches of FIGS. 7, 9, 11, 12, 15, 16, and 21 show the fins being spaced apart, however, these figures are only for demonstration of the constellations, not to show the true dimensions.

Figure 9:
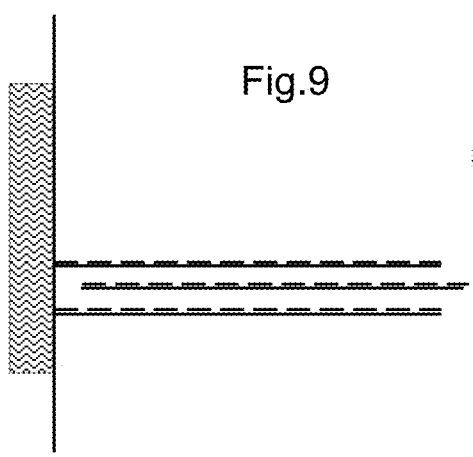
Figure 10:
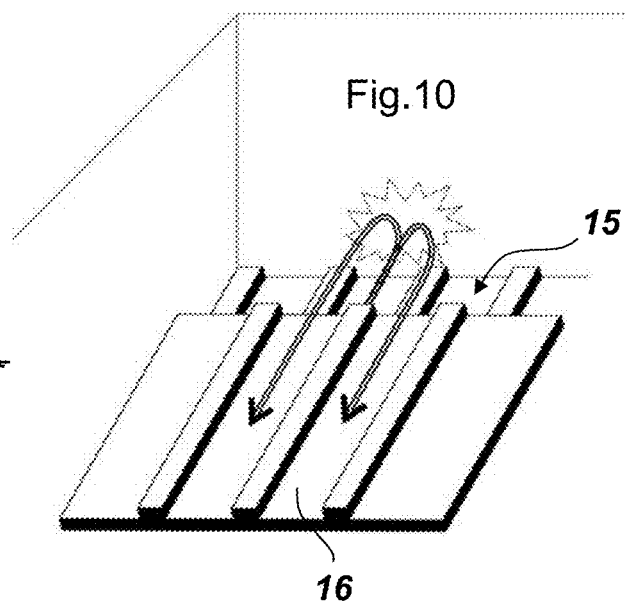
Figure 11:
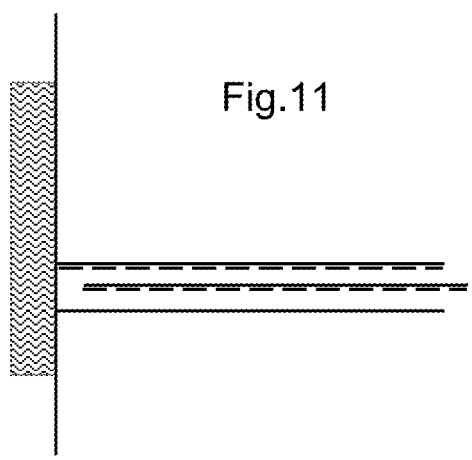

A further example is abstractedly shown in FIG. 9, where the fins are plates having a smooth surface on one side and having corrugations on the other side. One embodiment for this case is shown in the 3D view of FIG. 10, where the corrugated structure is achieved with grooves cut out from a plate, or with bars added to a plate. When the first unit fins and the second unit fins are contacting with an offset regarding their corrugations, they will form inbound channels 15 and reverse channels 16. The impingement on the root surface is indicated with the splash symbol and the split-up is indicated with the double-lined arrow showing the flowing direction of the coolant. Why FIG. 9 is undetermined about a second unit wall or root will be understood when arriving at another embodiment further below. FIG. 11 shows an example of fin structures that corresponds to the example of FIGS. 9 and 10 just the other way around.

A further embodiment of a combination of first and second unit of a cooler is shown with FIGS. 12, 13, and 14, where the second unit can be of a material that is cheaper to manufacture, e.g. plastic. The first unit having a surface for receiving a part to be cooled can be made of a material that has very good thermal conductivity, e.g. aluminium. Machining aluminium with smooth fins is easier compared to the waved-structured fins shown in FIGS. 1 to 5. FIG. 12 shows on the left said first unit with the smooth plates and on the right the second unit, which (can be, but here) is not intended for receiving a part to be cooled, having a double-sided corrugated structure. The fins of the first and second unit are abutting at least such that the form an inbound channel 17. In particular, the channel 17 is at least formed in the area of the second unit fin front, i.e. shortly before the coolant is entering the root area to impinge on the first unit wall. FIG. 14 shows an example how the fins are abutting and how the coolant is redirected. The reverse channels 18 are in this case also starting right at the second unit fronts where the first unit fins are abutting. It would be possible to keep some distance for the reverse flow such that no reverse "channels" are formed but a reverse flow (see FIG. 18). It must be noted that most importantly, it is the inbound coolant which is formed by channels in order to impinge on the root area in the form of a jet that will split up or broaden or swirl after it impinged on the root. In the shown example (FIG. 14), the reverse flow is immediately introduced in reverse channels 18 which are arranged offset to the inbound channels 17. This channel offset O2 is to be understood with reference to an axis which is aligned perpendicular to the channels and parallel to the fins.

FIG. 15 shows a similar constellation, wherein only the first unit 19 has double-sided structured fins and the second unit has plain fins and a second surface for receiving electronics to cool. A person of skill in the art will see that there are various possibilities to apply the inventive principle.

Figure 16:
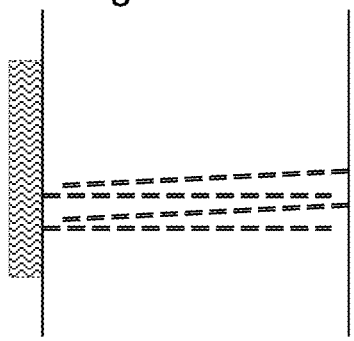
Figure 17:
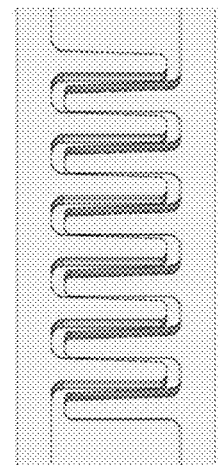
Figure 18:
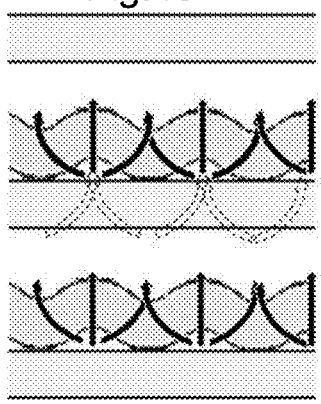

FIG. 16 shows in an exaggerated sketch that the fins of the first unit have an inclination relative to the fins of the second unit. This is shown with the example of each of the units having double-sidedly structured fins, however other structure constellations may be applicable. FIG. 17 shows this inclination with a side view of intertwining fins. The inbound channels are only formed shortly before the coolant hits the impingement zone (root) at the respective root. As a result, after impinging, the coolant is not introduced into a reverse channel. However, the inbound channels forming little jets that can impinge on the root still leads to an advantageous cooling effect according to the first aspects of the invention. After impinging, the coolant is whirled around generating turbulences. FIG. 18 shows how the reverse flow is entering an open duct instead of the offset channels as known from the other embodiments.

Figure 19:
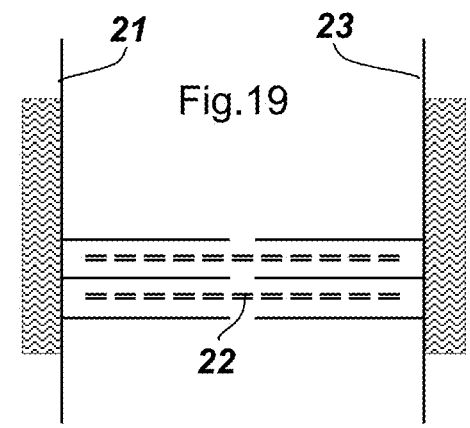
Figure 20:
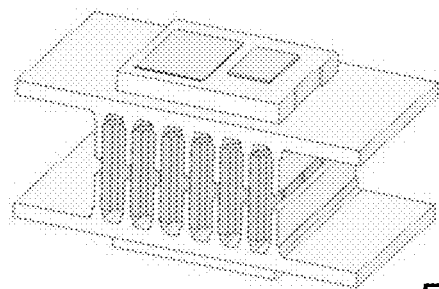
Figure 20:
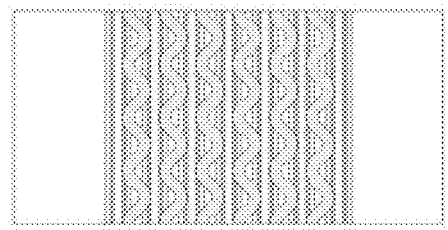
Figure 20:
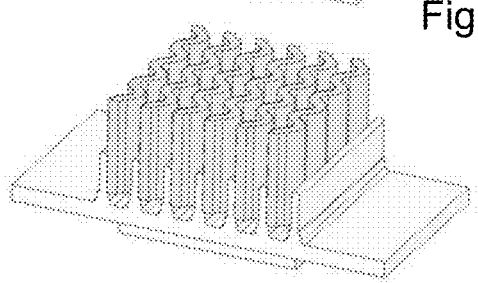
Figure 20:
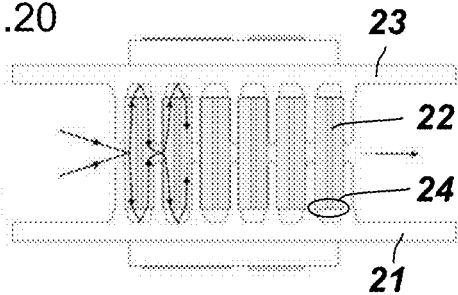

FIG. 19 and the four parts of FIG. 20 show an embodiment with a first unit 21, a second unit 22, and a third unit 23. The second unit is in this case an insert 22 having a both-sidedly corrugated structure. As second unit 22 counts every structured fin that is inserted into the cavities (so not only the one labelled in FIG. 19, but the whole set). This set of fins 22 can be clamped between the first and second unit 21, 23. To fix the second unit 22 without clogging the root section, said assemblies 21, 23 may have shoulders 24 for the fronts of the second unit to abut. However, other means such as notches on the fins of the second unit 22 could also be another embodiment for fixating the second unit 22 in the assembly. Due to the shoulders 24, the waved fins keep a gap to the roots such that the coolant can flow through the construction as indicated in the lower right part of FIG. 20. The coolant is fed between the first unit 21 and the third unit 23 and splits up into the shown two opposing directions towards the first unit first root and the third unit first root. The second unit 22 fins abutting the fins of the first and third unit forms channels in which the coolant is flowing. After impinging on the respective root it flows back on the other side of the second unit fin where channels are formed, too. At the area where the coolant now confronting, it distributes to the next "floor" or "storey", i.e. it flows around the second fins of the first and third unit, where the second unit second fin is again forming inbound channels. This embodiment is also relatively simple to machine while still providing the inventive principle. For example, as second unit, a plastic injection moulding part can be used since it does not need to necessarily have a good thermal conductivity and its purpose is mainly to form the inbound channels and the reverse channels offset to the inbound channels.

Figure 21:
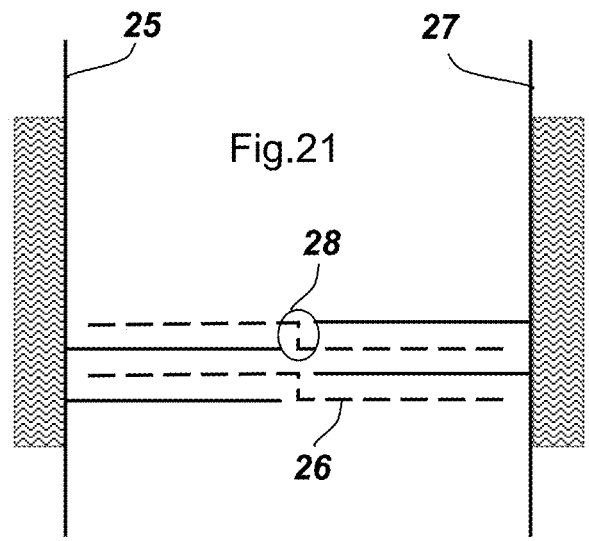
Figure 22:
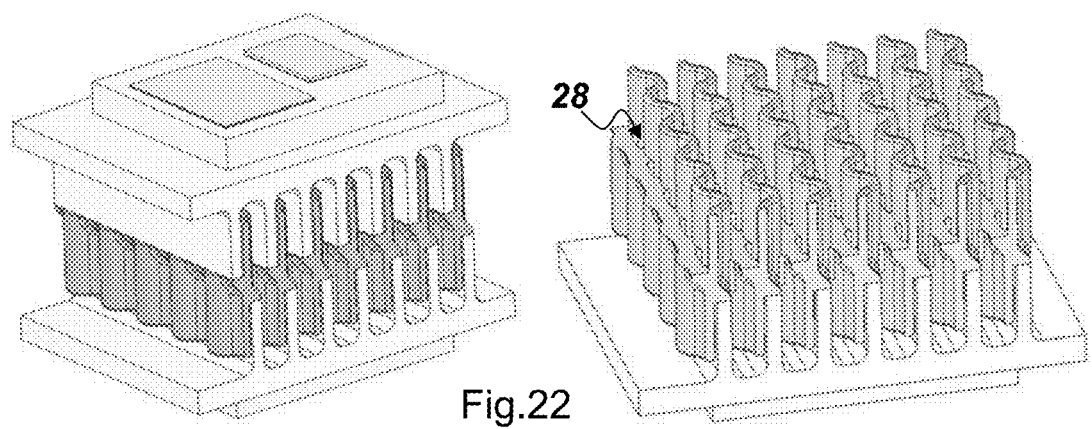

Another embodiment is shown with FIGS. 21 and 22, where a second unit 26 is a set of corrugated sheets each having a bend in the middle. The first unit 25 and the third unit 27 are similar to the ones from the embodiment of FIGS. 19 and 20, i.e. ribbed aluminium parts, with the difference that they are arranged offset relative to each other such that the fins can each rest on one of said bends in the second unit fins. In the area of each bend of the second unit fins there is an opening 28 for conducting the coolant. In this way, the coolant is guided through this labyrinth in the inventive manner wherein upon impinging the coolant flow is split apart and discharged from the root area in offset reverse channels.

Whatever way the cooler according to the first aspects of the invention might be embodied, a part to be cooled can be applied with the following configuration. The heatsink can be coated with thermally sprayed ceramic as electrical insulation. Between the ceramic layer and the heatsink, an intermediate layer can be applied to relieve the thermal stresses. The semiconductor device (=part to be cooled) can be mounted by means of a thermal paste and a mechanical fixation or by thermally conductive adhesives. With this special attachment, the electronic part is electrically isolated but the generated heat can be dissipated very effectively.

Figure 23:
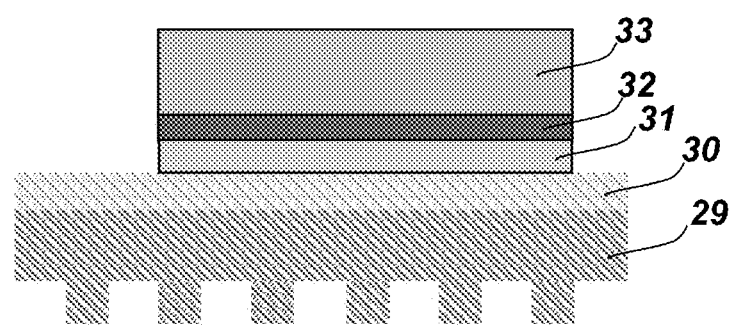

An exemplary configuration is shown in FIG. 23. The first unit 29 has on the opposite site of the roots (where the cooling impingement takes place) the surface to receive the part to be cooled 33. Said surface may have a coating 30 which is flame-sprayed and only 100-300 micrometer thin. For example, such coating is made of $Al_2O_3$ or AlN. Intermediate layer 31 is optional and can consist of a cooper-based material. Thermal conductive layer 32 can for example be a glue, paste, or wax which is thermally conductive. This solution avoids the manufacturing step of soldering and allows for lesser interfaces compared to solutions known in the art.

Figure 24A:
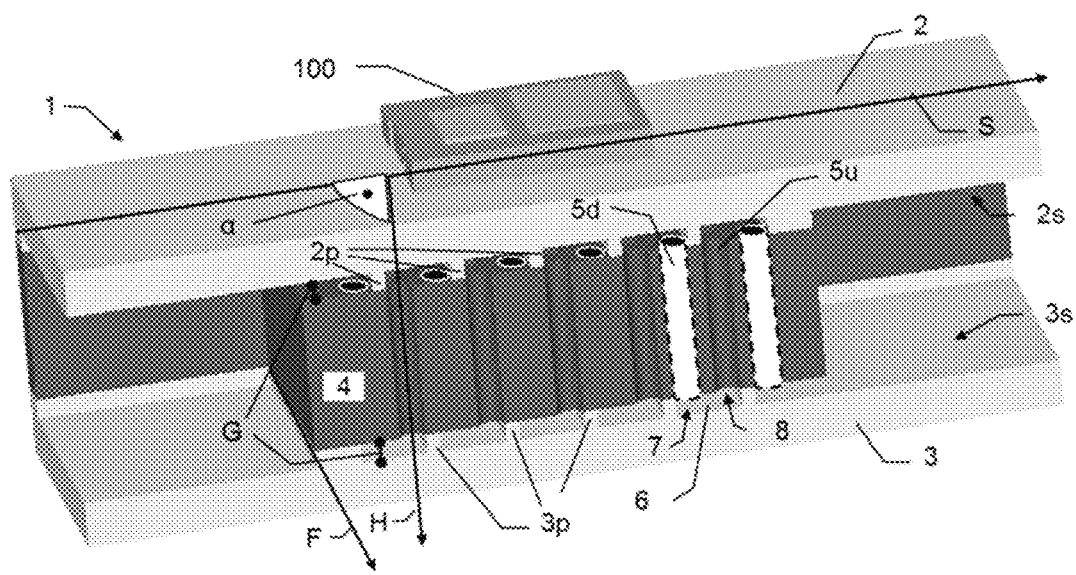
FIGS. 24a to 24c show a first embodiment of a cooler body according to the second aspects of the invention.
Figure 24B:
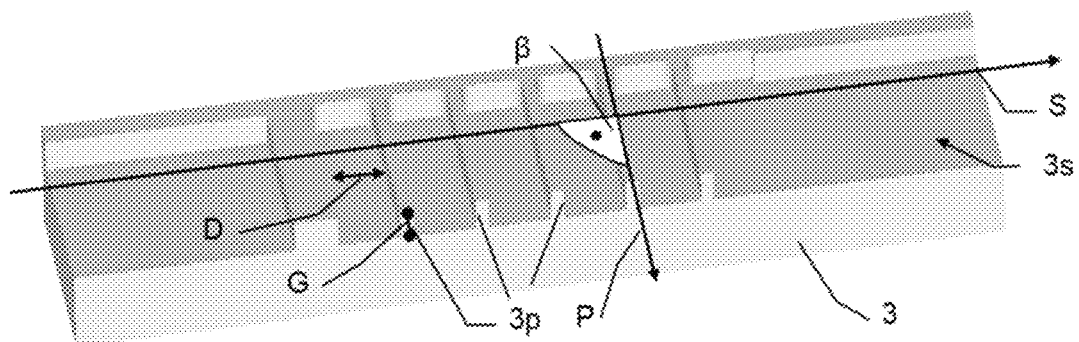
Figure 24C:
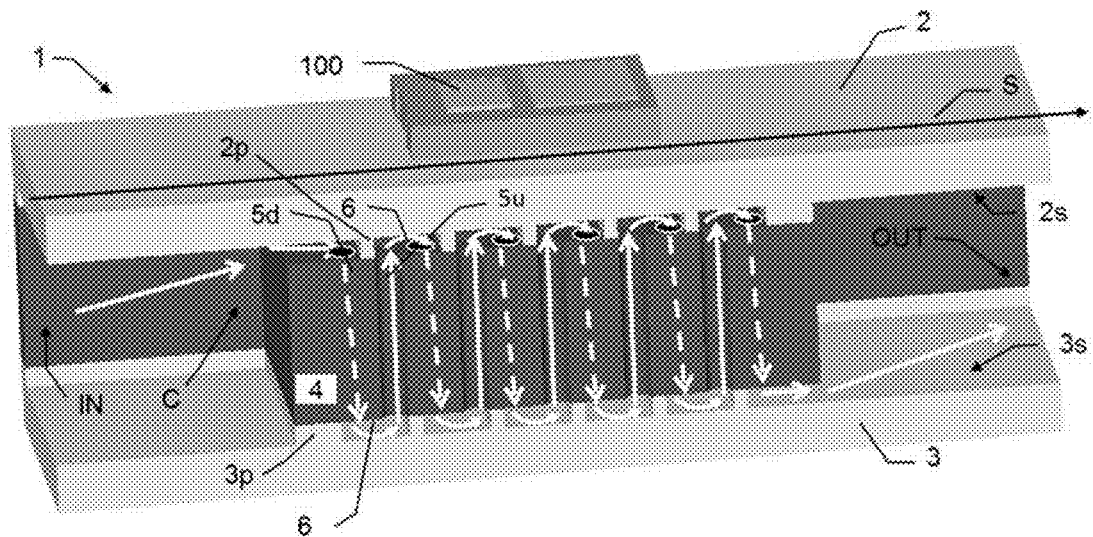

Second Aspects of the Invention:

FIG. 24a-24c show a first embodiment of a cooler body 1 according to the second aspects of the invention, together with a part 100 to be cooled, e.g. a power electronic element such as a MOS-FET or IGBT, in particular as part of an automotive electronic circuit. As shown in FIG. 24a in a 3D-view, the cooler body 1 comprises three main parts, a contact piece 2, a middle piece 4 and a base piece 3. The electronic component 100 to be cooled is preferably directly contacted by the contact piece 2, e.g. by a thermal adhesive, a thermal grease or some other interface material with high thermal conductivity.

The body 1 can be made from metal such as aluminum or copper, whereby the three pieces 2, 3, 4 can be made from metal sheets joined together by soldering or brazing. Joining techniques such as sintering can be used as well wherefore an intermediate sinter layer between metal sheets is used. But preferably, the body 1 is made from thermally conductive but electrically insulating ceramic such as aluminium nitride or aluminium oxide, wherefore advantageously there is no need for an additional electric insulation layer. The body 1 preferably is a monolithic body 1. A monolithic ceramic body 1 is e.g. formed by manufacturing the three individual parts 2, 3, 4 first as "green" ceramic parts and then sintering all three parts 2, 3, 4 together in one step. Thus, additional assembly steps and thermal interfaces can be avoided. Alternatively, the base piece 3 and the contact piece 2 are manufactured from two layers of "green" ceramic instead of one. This would simplify the forming process of the unsintered ceramic. In this case preferably some additional ribs are added to stabilize the structure. (The body 1, alternatively, can be metallic and insulations are added for cooling the electronic components.)

The contact piece 2 and the base piece 3 are spaced apart by the middle piece 4 in between. In the example, the contact piece 2 and the base piece 3 embodied as long plates, arranged parallel to each other and extending in a direction S.

The middle piece 4 is in the example embodied as a block, shorter than the plates 2, 3 in extension direction. The middle piece 4 is perforated, the holes 5u, 5d serving a coolant pipes. Thus, the middle piece 4 comprises a multitude of pipes 5u, 5d arranged parallel to each other. The pipes 5d, 5u run from the facing surface 2s of the contact piece 2 to the facing surface 3s of the base piece 3, thereby at least roughly perpendicular to the surface 2s and surface 3s or the angle between the extension direction H of each hole 5u, 5d and the extension direction S of the plates 2, 3 is a right angle (90°).

The three pieces 2, 3, 4 are layered one above the other, forming in the example a sandwich-like structure. As an alternative to the sandwich-like structure shown in the example, wherein the two enclosing surfaces 2s, 3s face each other, the surfaces 2s, 3s are arranged in an angle, e.g. orthogonal, to each other, or are "reversed" parallel to each other, the body 1 then forming a U-like structure. Accordingly, the pipes 5d, 5u then are not straight as shown in FIG. 24a but angled or formed like a "U". As an option, the base piece 4 is also embodied as a contact piece for thermal contact to the part to be cooled.

The surfaces 2s, 3s facing the pipes 5d, 5u serve as enclosing surfaces. A small gap G is between the middle piece 4 and base piece 3 as well as between middle piece 4 and contact piece 2; or more precisely, there is a gap G between each end of pipes 5u, 5d and each enclosing surface 2s, 3s.

Each gap G is established by protrusions 2p, 3p distributed on each enclosing surface 2s, 3s. Said otherwise, there are protrusions 2p, 3p on the inner side 2s, 3s of contact plate 2 and base plate 3 which serve as distance holders to the pipe piece 4 in the middle. The gaps G allow for coolant to enter or exit in the pipes 5u, 5d between the outer pieces 2, 3 and the inner piece 4.

According to the second aspects of the invention, the protrusions 2p, 3p are designed such that they serve as barriers in the longitudinal direction S. Preferably, they are designed as fin-like structures as shown.

For better view of such fin-like protrusions, FIG. 24b shows only the base plate 3s with fin-like structures 3p on the enclosing surface 3s. The fin-like structures 3p are arranged perpendicular to the extension direction S or the angle β between the extension direction P of each fin 3p and the extension direction S is a right angle or at least roughly 90°.

In the example, the fins 3p are embodied as straight fins. Alternatively, they are wave-like or zig-zag formed. The height of the protrusions 3p define the gap G between enclosing surface 3s and the pipes of the middle piece.

The fins 3p are arranged successively and spaced (equally) apart from each other on the enclosing surface 3s. The distance D between two successive protrusions 3p of a respective piece 2 or 3 is matched to the diameter of the pipes such that is encompasses two successive pipes. The contact piece 2 is designed accordingly, however with an offset of (roughly) one pipe (diameter) with respect to the base piece 3, which is explained in more detail below.

Referring again to FIG. 24a, it can be seen that thus, two successive protrusions 2p or 3p together with the part of the respective enclosing surface 2s and 3s in between (and an end face of the middle piece 4) form some sort of chamber or cavity 6, with the end 7 of one pipe 5d as a first opening and the end 8 of the following pipe 5u as a second opening. In other words, the cavity 6 connects (the end 7 of) one pipe 5u with (the end 8 of) the subsequent pipe 5d.

According to the second aspects of the invention, the enclosing surfaces 2s, 3s or more particularly the cavities 6 connect the pipes 5u, 5d such that at least two coolant channels result, from a first pipe 5d, running multiple times from the contact piece 2 to the base piece 3 and vice versa through the pipes 5u, 5d and cavities 6 in between the pipes 5u, 5d. In the exemplary embodiment according to FIGS. 24a-24c, the protrusions 2p and hence the "upper" cavities 6 at the contact piece 2 are at least one pipe (diameter) offset—preferably offset more than one pipe diameter—with respect to the protrusions 3p and hence the "below" cavities 6 at the base piece 3 in extension direction S to achieve this result of directionally alternating channels. Such an alternating channel C is in more detail illustrated in FIG. 24c.

FIG. 24c illustrates schematically in a 3D-view such an alternating coolant channel C according to the second aspects of the invention, indicated by the bright arrows inside the cooler body 1 (for ease of illustration, only one of the two or more channels is explicitly depicted). A coolant (not shown) enters the cooler body 1 respectively a channel C at an inlet IN (in the figure at the left side) in direction of the extension direction S of the cooler body 1. The coolant is first directed at the inner or enclosing surface 2s of the contact piece 2 (indicated by the first two left arrows), where the coolant takes heat from the contact piece 2 respectively the electronics 100.

Then due to a first protrusion 2p of the enclosing surface 2s of the contact piece 2, the channel C runs the first time "down" from the contact piece 2 to the base piece 3 through a first pipe 5d (indicated by the first dashed arrow from the left).

Then, there is a first base piece cavity 6, formed by the enclosing surface 3s with two successive protrusions 3p of the base piece 3, the cavity connecting the end of said first pipe 5d with an end of the pipe 5u following in direction S. Said otherwise, the exit of the first pipe 5d flows into cavity 6 and the base-side opening of the second pipe 5u is exit of cavity 6. The channel C thus is redirected about 180° or in other words makes a U-turn (indicated by the first bent arrow). Thus, the coolant exiting from the first pipe 5d forms an impinging flow on the enclosing surface 2s and enters the second pipe 5u.

The channel C then runs back or "up" to the contact piece 2 according to the second pipe 5u ((indicated by the upwards continuous arrow). The "upwards" pipe 5u leads into contact piece cavity 6 at contact piece 2. Here, the coolant again can take up heat from contact piece 2 respectively electronics 100.

There again, the channel C is redirected about 180° due to cavity 6, leading into a second "downwards" pipe. Said otherwise, the coolant now sinks second time from the contact piece 2 to the base piece 3 through the next pipe of holey middle piece 4. As can be seen, the fin-like structures 2p, 3p of the outer parts 2, 3 separate the coolant between the holes and thus forcing the fluid to return in the next hole.

This "down- and upwards" course from the contact piece 2 to the base piece 3 of channels C is repeated several times (in the example five times). Hence, the structure of the coolant body 1 as suggest provides in a simple and compact way channels C or coolant flow which alternates multiple times between the contact piece 2 and the base piece 3 between inlet IN and outlet OUT of the cooler body 1. The design enables an impact or impingement coolant flow on the contact piece 2 (and base piece 3) and a relatively large contact area between coolant and contact piece 2 resp. surface 2s/3s for heat transfer.

Figure 25:
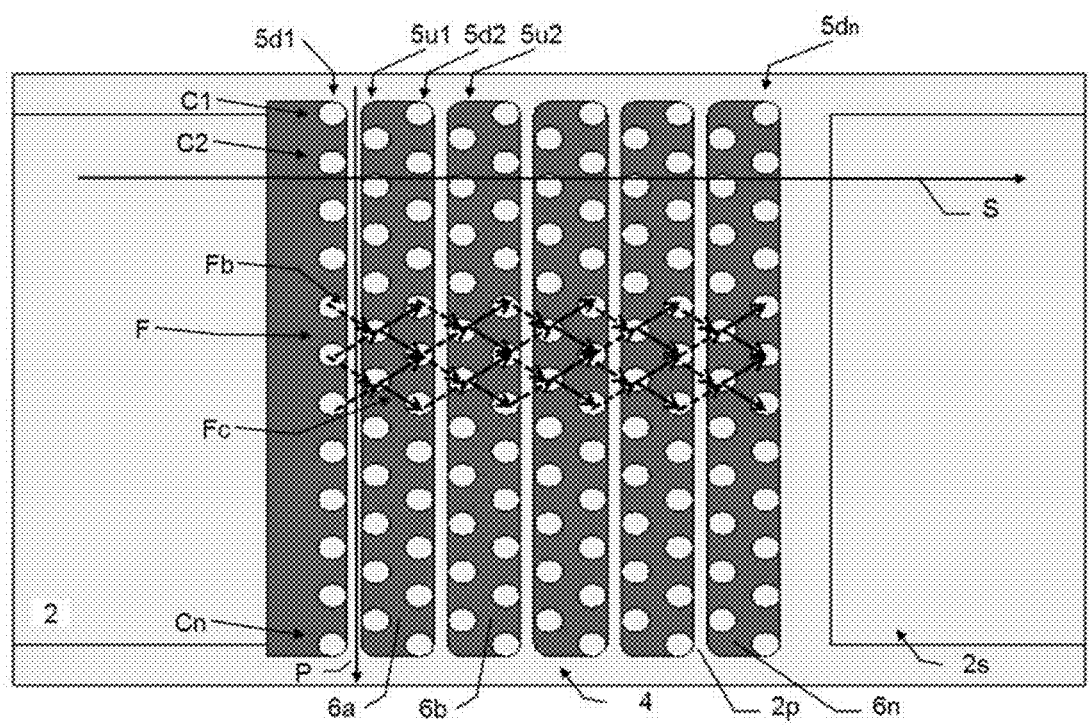

FIG. 25 shows a further embodiment according to the second aspects of the invention. Shown is in a bird's eye view the base piece 2 and a cross section of the middle piece 4.

In this embodiment, several parallel channels C1, C2, ... Cn with alternating direction between contact piece 2 and base piece 3 as described above are present, provided by rows $5d1$, $5u1$, $5d2$, $5u2$, ... $5dN$ of holes in the middle piece 4. The rows of pipes $5d1$, $5u1$, $5d2$, $5u2$, ... $5uN$ are separated in extension direction (or general direction of the coolant flow F) by base side protrusions 2p, extending along the whole wide of the middle piece 4 in direction P orthogonal to direction S (likewise, but one pipe offset separation is effected by such base side protrusions, not shown in FIG. 25).

Preferably, the difference between the total number of channels $C_{dtotal}$ ($\Sigma Cn@5d_n$) at a given pipe row say $5d_n$ and the total number of channels at the same pipe row $C_{utotal}$ ($\Sigma Cn@5u_{n+1}$) is one. The difference between the total number of channels $C_{dtotal}$ ($\Sigma Cn@5d_n$) at a given pipe row say $5d_n$ and the total number of channels of the neighbouring pipe row $C_{utotal}$ ($\Sigma Cn@5u_n$) is one as well. However, the second aspects of the invention also work with equal number of channels.

By the protrusions 2p, cavities 6a, 6b ... 6n are provided which connect subsequent pipe rows 5u1, 5d2 for redirection of each channel C1 ... Cn from "upwards" to "downwards". The flow of coolant impinging on the enclosing surface 2s is turned round each time and for each channel C1 ... Cn.

In the exemplary embodiment, the holes are offset in direction S. Said otherwise, only each second pipes row 5d1 ... 5dN is positioned equally in direction S. Coolant flowing for example into chamber 6a by a pipe of row 5u1 is distributed into the next two nearest pipes of the subsequent row 5d2 (indicated in the figure by continuous arrows Fc). This is equally effected at the base side (indicated in the figure by dashed arrows Fb), i.e. that same effect is observed on the base side.

Thus, a pipe of for example row 5u1 is not part of only one channel (for example C1), but of two channels (C1 and C2). Due to the offset arrangement of pipe rows 5d1 ... 5uN, each channel C1 ... Cn is allocated to more than one pipe of each row 5d1 ... 5uN. Therefore, the flow F of a coolant liquid is not only alternating "up" and "down" as described with respect to FIGS. 24a-24c, but addition alternates (in a far more limited way) in "left" and "right" direction. This pipe or channel arrangement enables a low-turbulent flow F that allows for a high heat transfer at low pressure-drop which enhances heat absorption or release of the coolant.

Although the first and second aspects of the invention are illustrated above, partly with reference to some preferred embodiments, it must be understood that numerous modifications and combinations of different features of the embodiments can be made. All of these modifications lie within the scope of the appended claims.

The invention claimed is:

1. A cooler comprising:
an inlet configured for feeding the cooler with coolant;
an outlet configured for discharging said coolant;
a first unit comprising a first plane for receiving a first part to be cooled, a first unit first fin, and a first unit second fin, wherein
the first unit first fin extending from a first unit first root to a first unit first fin front,
the first unit second fin extending from the first unit first root to a first unit second fin front,
the first plane being in uninterrupted thermal contact with the first unit first root,
the first unit first fin having a first unit first fin first surface,
the first unit second fin having a first unit second fin first surface; and
a second unit comprising a second unit first fin, the second unit first fin having a second unit first fin first front, a second unit first fin first surface, and a second unit first fin second surface, the second unit first fin located at least in part between the first unit first fin and the first unit second fin such that
the first unit first root is adjacent to the second unit first fin first front leaving a first gap,
the first unit first fin first surface is abutting the second unit first fin first surface, and
the first unit second fin first surface is abutting the second unit first fin second surface;
at least one of the first unit first fin first surface and the second unit first fin first surface having a first corrugated structure, the first corrugated structure forming first inbound channels between the first unit first fin first surface and the second unit first fin first surface, wherein at least one first inbound channel being configured for
forming a first coolant inbound flow from the first unit first fin first front towards the first unit first root, and
causing the first coolant inbound flow to impinge and laterally widen on the first unit first root.

2. The cooler according to claim 1, wherein
at least one of the first unit second fin first surface and the second unit first fin second surface having a second corrugated structure,
the second corrugated structure forming first reverse channels between the first unit second fin first surface and the second unit first fin second surface,
the first reverse channels being offset relative to the first inbound channels, and
each of two neighbouring first reverse channels, which are closest to the first inbound channel, being configured for
receiving a part of the impinged and widened first coolant inbound flow, and
forming a first coolant reverse flow from the first unit first root towards the first unit second fin front.

3. The cooler according to claim 2, wherein
the second unit first fin first front being a second unit first fin front, the first unit second fin having a first unit second fin second surface,
the second unit comprising a second unit second fin,
the second unit second fin having a second unit second fin front and a second unit second fin first surface,
the second unit first fin extending from a second unit first root to the second unit first fin front,
the second unit second fin extending from the second unit first root to the second unit second fin front,
the first unit second fin located between the second unit first fin and the second unit second fin such that the second unit first root is adjacent to the first unit second fin front leaving a second gap,
the first unit second fin second surface is abutting the second unit second fin first surface,
the first reverse channels being second inbound channels,
the first coolant reverse flow being a second coolant inbound flow,
at least one second inbound channel being configured for
forming the second coolant inbound flow from the second unit first fin front towards the second unit first root, and
causing the second coolant inbound flow to impinge and laterally widen on the second unit first root,
at least one of the second unit second fin first surface and the first unit second fin second surface having a third corrugated structure,
the third corrugated structure forming second reverse channels between the second unit second fin first surface and the first unit second fin second surface, the second reverse channels being offset relative to the second inbound channels, and
each of two neighbouring second reverse channels, which are closest to said second inbound channel, being configured for
receiving a part of the impinged and widened second coolant inbound flow, and
forming a second coolant reverse flow from the second unit first root towards the second unit second fin front.

4. The cooler according to claim 2, wherein
the second unit first fin having a second unit first fin second front opposing the second unit first fin first front,
the cooler comprising a third unit, the third unit comprising a third unit first fin, and a third unit second fin,
the third unit first fin extending from a third unit first root to a third unit first fin front,
the third unit second fin extending from the third unit first root to a
third unit second fin front,
the third unit first fin having a third unit first fin first surface,
the third unit second fin having a third unit second fin first surface.

5. The cooler according to claim 4, wherein
the second unit first fin further located at least in part between the third unit first fin and the third unit second fin such that
the third unit first root is adjacent to the second unit first fin second front leaving a third gap,
the third unit first fin first surface is abutting the second unit first fin first surface, and
the third unit second fin first surface is abutting the second unit first fin second surface.

6. The cooler according to claim 4, wherein
the second unit first fin further located at least in part neighbouring the third unit first fin such that
the third unit first root is adjacent to the second unit first fin second front leaving a fourth gap,
the third unit first fin first surface is abutting the second unit first fin second surface, and
the third unit first root being arranged for receiving coolant from the inlet.

7. The cooler according to claim 4, wherein
the third unit comprising a plane for receiving a second part to be cooled, and
the third plane being in uninterrupted thermal contact with the third unit first root.

8. The cooler according to claim 1, wherein
the cooler being an electronic element cooler,
the first part to be cooled being an electronic element,
the second unit being of a plastic material, and
the first unit and the second unit are configured for forming a housing.

9. The cooler according to claim 1, wherein
the inlet being arranged and configured to be upstream to the first gap,
the outlet being arranged and configured to be downstream to the first reverse channels, and
the first unit or the second unit being a finned component of a material containing aluminium.

10. The cooler according to claim 1, wherein
the first unit first root is configured for causing a split-up of the first coolant inbound flow into two part-flows,
the two part-flows entering the two neighbouring first reverse channels, and
the first unit first root being one side of a heat-conducting cooler wall, and the first plane being an opposite side of the heat-conducting cooler wall.

* * * * *